US008917568B2

(12) United States Patent
Chen et al.

(10) Patent No.: US 8,917,568 B2
(45) Date of Patent: Dec. 23, 2014

(54) METHOD OF OPERATING PSRAM AND RELATED MEMORY DEVICE

(71) Applicant: Etron Technology, Inc., Hsinchu (TW)

(72) Inventors: Ho-Yin Chen, Hsinchu County (TW); Shi-Huei Liu, Hsinchu County (TW)

(73) Assignee: Etron Technology, Inc., Hsinchu (TW)

( * ) Notice: Subject to any disclaimer, the term of this patent is extended or adjusted under 35 U.S.C. 154(b) by 73 days.

(21) Appl. No.: 13/772,342

(22) Filed: Feb. 21, 2013

(65) Prior Publication Data

US 2014/0043888 A1   Feb. 13, 2014

(30) Foreign Application Priority Data

Aug. 10, 2012 (TW) .............................. 101128970 A

(51) Int. Cl.
  *G11C 7/00* (2006.01)
  *G11C 11/419* (2006.01)
  *G11C 11/4063* (2006.01)
  *G11C 11/406* (2006.01)

(52) U.S. Cl.
  CPC .......... *G11C 11/419* (2013.01); *G11C 11/4063* (2013.01); *G11C 11/40615* (2013.01)
  USPC ......................... 365/222; 365/194; 365/233.1

(58) Field of Classification Search
  CPC ................... G11C 2211/4066; G11C 11/419; G11C 11/413; G11C 11/40615
  USPC ......... 365/222, 233.1, 194, 191, 193, 230.08, 365/203, 233.5
  See application file for complete search history.

(56) References Cited

U.S. PATENT DOCUMENTS

| | | | |
|---|---|---|---|
| 4,809,233 A * | 2/1989 | Takemae | 365/222 |
| 5,206,830 A * | 4/1993 | Isobe et al. | 365/194 |
| 6,977,865 B2 * | 12/2005 | Jeong | 365/233.16 |
| 7,120,085 B2 * | 10/2006 | Lee | 365/233.1 |
| 7,301,842 B2 * | 11/2007 | Lee | 365/222 |
| 7,327,631 B2 * | 2/2008 | Kim | 365/229 |

\* cited by examiner

*Primary Examiner* — Gene Auduong
(74) *Attorney, Agent, or Firm* — Winston Hsu; Scott Margo

(57) ABSTRACT

The latency of a PSRAM is set according to its current state when receiving an external command. If the PSRAM is not executing a specific operation or has completed the specific operation while meeting corresponding timing parameters, the PSRAM is configured to execute the external command with a first latency. If the PSRAM is executing the specific operation or has completed the specific operation before meeting corresponding timing parameters, the PSRAM is configured to execute the external command with a second latency larger than the first latency.

12 Claims, 4 Drawing Sheets

US 8,917,568 B2

METHOD OF OPERATING PSRAM AND RELATED MEMORY DEVICE

BACKGROUND OF THE INVENTION

1. Field of the Invention

The present invention is related to a method of operating a PSRAM and related memory device, and more particularly, to a method of automatically adjusting latency of a PSRAM and related memory device.

2. Description of the Prior Art

Random access memory is a data storage device categorized into two types: static random access memory (SRAM) and dynamic random access memory (DRAM). In DRAM, each memory cell includes a transistor and a capacitor. The capacitor may either be charged or discharged. The transistor may function as a switch which allows a peripheral control circuit to access or change the status of the capacitor. Due to capacitor charge leakage, DRAM is required to periodically execute refresh operation in order to maintain accurate data. In SRAM, each memory cell includes bistable latching circuitry capable of storing date without executing refresh operation when powered. SRAM has faster data access, but occupies larger space and consumes more power.

Pseudo-static random access memory (PSRAM) adopts the memory cell structure of DRAM and the timing control of SRAM. It combines the high density of DRAM with the ease of use of SRAM. PSRAM offers variable latency with which the wait time for accessing a specific column address may be adjusted. The unit of latency is the period of the central clock signal. A larger latency means slower data access. When receiving an external command, a PSRAM may be executing a specific operation or has completed the specific operation but before meeting corresponding timing parameters. Under such circumstance, the PSRAM whose latency is set to one clock period can provide faster data access, but may not be able to access data accurately; the PSRAM whose latency is set to two clock periods is given sufficient time to complete the specific operation and meet corresponding timing parameters, but the overall data access speed is compromised.

SUMMARY OF THE INVENTION

The present invention provides a method of operating a PSRAM. The method includes executing an external command with a first latency if the PSRAM is not executing a specific operation or has completed the specific operation and met a corresponding timing parameter when receiving the external command; or executing the external command with a second latency larger than the first latency if the PSRAM is executing the specific operation or has completed the specific operation but before meeting the corresponding timing parameter.

The present invention also provides a memory device with an automatically adjustable latency. The memory device includes a PSRAM configured to operate according to an external command; a status detector configured to determine a current state of the PSRAM when receiving the external command; and a delay controller configured to set the latency of the PSRAM according to the current state.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
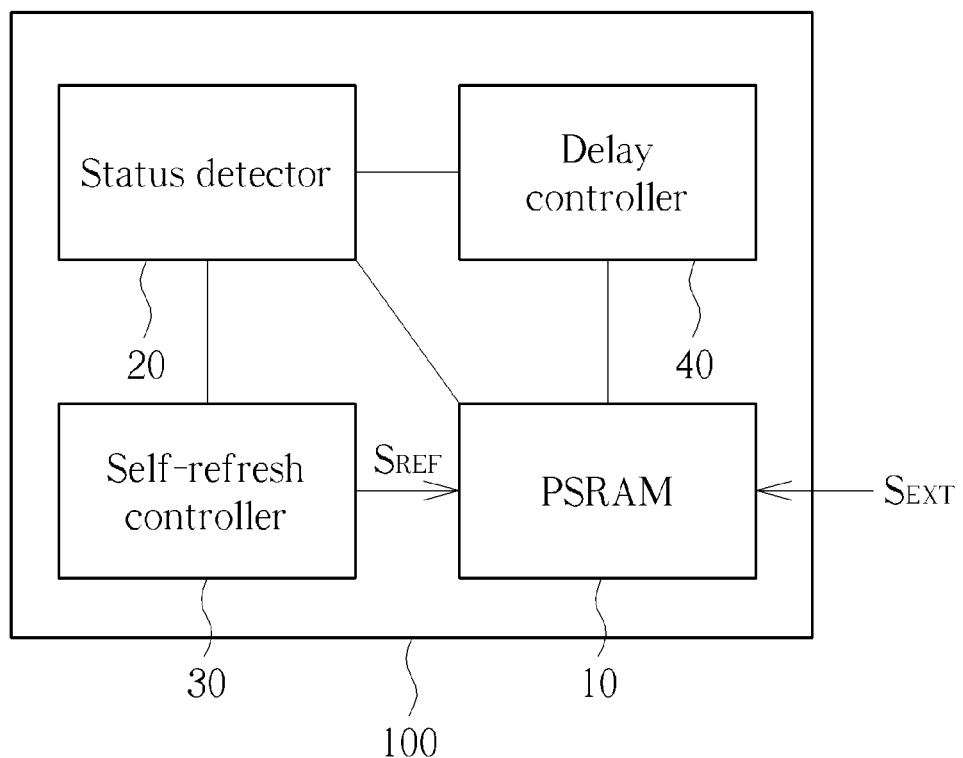
FIG. 1 is a diagram illustrating a functional diagram of a memory device with automatic latency adjustment according to the present invention.

FIG. 1 is a diagram illustrating a functional diagram of a memory device 100 with automatic latency adjustment according to the present invention. The memory device 100 includes a PSRAM 10, a status detector 20, a self-refresh controller 30, and a delay controller 40. The PSRAM 10 is configured to function according to an external command $S_{EXT}$ or an internal refresh signal $S_{REF}$. The status detector 20 is configured to detect the status of the PSRAM 10 and control the operation of the self-refresh controller 30 and the delay controller 40 accordingly. The self-refresh controller 30 is configured to provide the internal refresh signal $S_{REF}$, base on which the PSRAM may periodically perform refresh operation. The delay controller 40 is configured to set the latency of the PSRAM 10.

Figure 2:
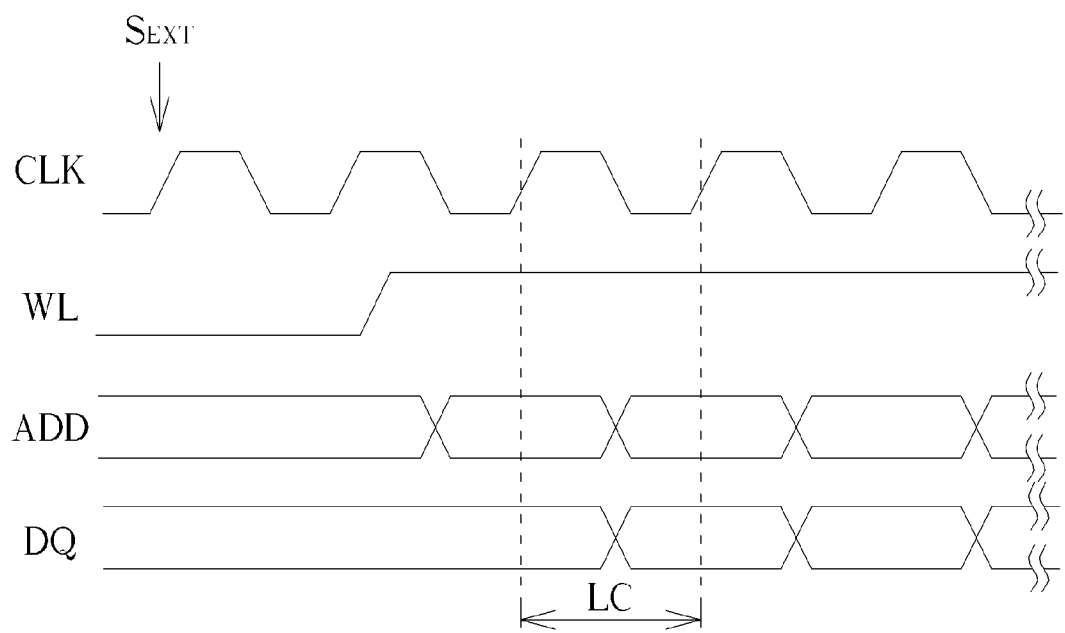
FIGS. 2-4 are timing diagrams illustrating the operation of the memory device according to the present invention.
Figure 3:
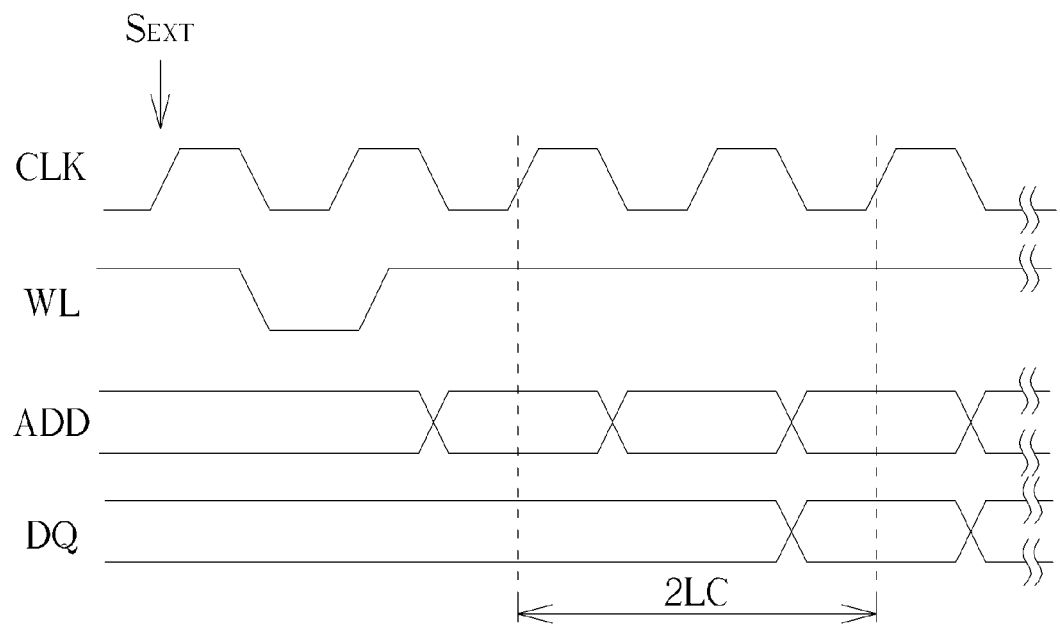
Figure 4:
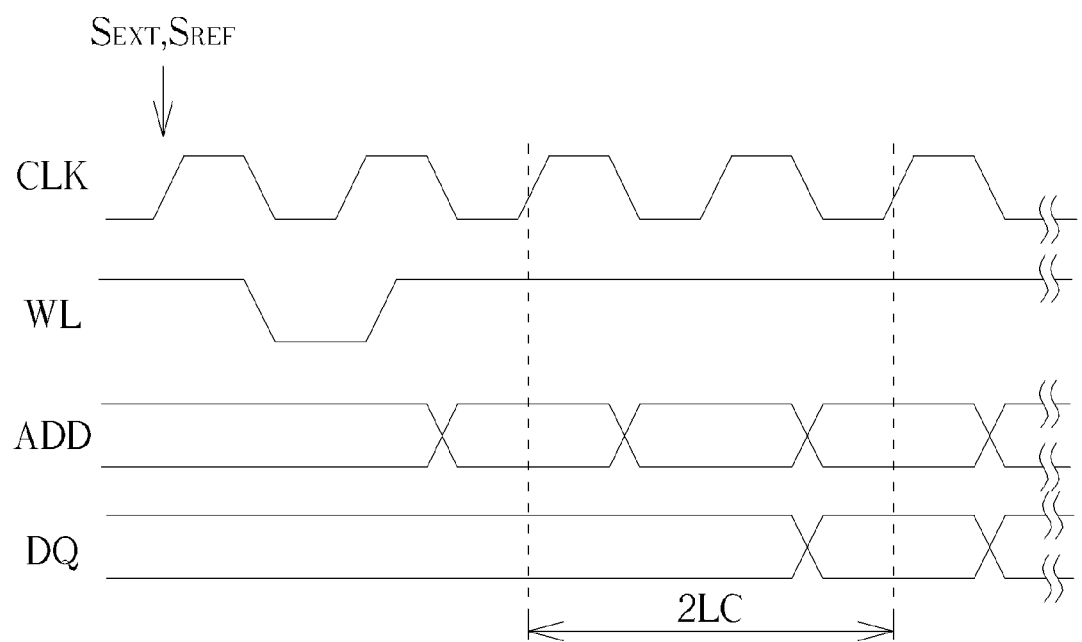

FIGS. 2-4 are timing diagrams illustrating the operation of the memory device 100 according to the present invention. "CLK" represents the central clock signal of the memory device 100. "WL" represents the voltage level of a specific word line in the PSRAM 10. "ADD" represents the address signal. "DQ" represents the signal from data pins.

In the embodiments of the present invention, the PSRAM 10 may operate in different states when receiving the external command $S_{EXT}$ associated with an "asynchronous read" operation. In the first state, the PSRAM 10 is not executing any specific operation, or has completed the specific operation and met a corresponding timing parameter. In the second state, the PSRAM 10 is executing a specific operation, or has completed the specific operation but before meeting a corresponding timing parameter. In the third state, the PSRAM 10 is executing a specific operation, or is required to execute self-refresh operation according to the internal refresh signal $S_{REF}$ after having completed the specific operation but before meeting a corresponding timing parameter.

In the present invention, the specific operation may include read, write, self-refresh or precharge operation. The timing parameter may include active to precharge delay $T_{RAS}$, write recovery time $T_{WR}$, row cycle time $T_{RC}$, or row address to column address delay $T_{RCD}$. The operations and timing parameters described above are merely for illustrative purposes, and do not limit the scope of the present invention.

In the embodiment illustrated in FIG. 2, when receiving the external command $S_{EXT}$, the status detector 20 may determine that the PSRAM 10 is currently operating in the first state. The PSRAM 10 may start to execute asynchronous read operation immediately. Meanwhile, the self-refresh controller 30 continues to output the internal refresh signal $S_{REF}$, and the delay controller 40 is configured to set the latency of the PSRAM 10 to one clock cycle LC of the central clock signal CLK. The PSRAM 10 may thus execute the external command $S_{EXT}$ according to the latency LC.

In the embodiment illustrated in FIG. 3, when receiving the external command $S_{EXT}$, the status detector 20 may determine that the PSRAM 10 is currently operating in the second state. The PSRAM 10 may start to execute asynchronous read operation after completing the specific operation and meeting corresponding timing parameters. Meanwhile, the self-refresh controller 30 continues to output the internal refresh signal $S_{REF}$, and the delay controller 40 is configured to set the latency of the PSRAM 10 to two clock cycles 2LC of the central clock signal CLK. The PSRAM 10 may thus execute the external command $S_{EXT}$ according to the latency 2LC.

In the embodiment illustrated in FIG. 4, when receiving the external command $S_{EXT}$, the status detector 20 may determine that the PSRAM 10 is currently operating in the third state. The PSRAM 10 may start to execute asynchronous read operation after completing the specific operation and meeting corresponding timing parameters. Meanwhile, the delay controller 40 is configured to set the latency of the PSRAM 10 to two clock cycles 2LC of the central clock signal CLK. The PSRAM 10 may thus execute the external command $S_{EXT}$ according to the latency 2LC. On the other hand, the self-refresh controller 30 is configured to stop outputting the internal refresh signal $S_{REF}$ in order to prevent the data access time from being delayed by the self-refresh operation.

In conclusion, when receiving an external command signal associated with asynchronous read operation, the memory device according to the present invention may automatically adjust its latency according to the current status of the PSRAM, thereby optimizing the efficiency and accuracy of data access.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of operating a pseudo-static random access memory (PSRAM), comprising:
   determining a current state of the PSRAM when receiving an external command;
   executing the external command with a first latency if the current state is a first state, wherein when the current state is the first state, the PSRAM is not executing a specific operation, or has completed the specific operation and met a corresponding timing parameter; and
   executing the external command with a second latency larger than the first latency if the current state is a second state or a third state, wherein when the current state is the second state, the PSRAM is executing the specific operation, or has completed the specific operation but before meeting the corresponding timing parameter;
   wherein when the current state is the third state, the PSRAM is executing the specific operation, or is required to execute a self-refresh operation according to an internal refresh signal after having completed the specific operation but before meeting the corresponding timing parameter.

2. The method of claim 1, further comprising:
   the PSRAM periodically executing the self-refresh operation according to the internal refresh signal; and
   stopping the internal refresh signal if the external command is received at a time when the internal refresh signal indicates an execution of the self-refresh operation.

3. The method of claim 1, wherein the external command is associated with an asynchronous read operation.

4. The method of claim 1, wherein the specific operation is associated with a read operation, a write operation, the self-refresh operation, or a precharge operation.

5. The method of claim 1, wherein the timing parameter includes an active to precharge delay, a write recovery time, a row cycle time, or a row address to column address delay.

6. The method of claim 1, wherein the PSARM is further configured to operate according to a central clock signal, the first latency is equal to one period of the central clock signal, and the second latency is equal to two periods of the central clock signal.

7. A memory device with an automatically adjustable latency, comprising:
   a PSRAM configured to operate according to an external command;
   a status detector configured to determine a current state of the PSRAM when receiving the external command, wherein when the current state is a first state, the PSRAM is not executing a specific operation, or has completed the specific operation and met a corresponding timing parameter; when the current state is a second state, the PSRAM is executing the specific operation, or has completed the specific operation but before meeting the corresponding timing parameter; and when the current state is a third state, the PSRAM is executing the specific operation, or is required to execute a self-refresh operation according to an internal refresh signal after having completed the specific operation but before meeting the corresponding timing parameter; and
   a delay controller configured to set a latency of the PSRAM according to the current state, wherein when the current state is the first state, the delay controller controls the PSRAM for executing the external command with a first latency, and when the current state is the second state or the third state, the delay controller controls the PSRAM for executing the external command with a second latency, wherein the second latency is larger than the first latency.

8. The memory device of claim 7, wherein the external command is associated with an asynchronous read operation.

9. The memory device of claim 7, wherein the specific operation is associated with a read operation, a write operation, the self-refresh operation, or a precharge operation.

10. The memory device of claim 7, wherein the timing parameter includes an active to precharge delay, a write recovery time, a row cycle time, or a row address to column address delay.

11. The memory device of claim 7, wherein the PSARM is further configured to operate according to a central clock signal, the first latency is equal to one period of the central clock signal, and the second latency is equal to two periods of the central clock signal.

12. The memory device of claim 7, further comprising a self-refresh controller configured to:
   provide the internal refresh signal according to which the PSRAM is configured to periodically executing the self-refresh operation; and
   stop the internal refresh signal if the external command is received at a time when the internal refresh signal indicates an execution of the self-refresh operation.

* * * * *